(12) United States Patent
Abbott et al.

(10) Patent No.: US 6,194,777 B1
(45) Date of Patent: Feb. 27, 2001

(54) LEADFRAMES WITH SELECTIVE PALLADIUM PLATING

(75) Inventors: Donald C. Abbott, Norton; Paul R. Moehle, Seekonk, both of MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/126,635

(22) Filed: Jul. 30, 1998

(51) Int. Cl.[7] .................. H01L 23/495; H01L 23/48; H01L 23/52; H01L 29/40
(52) U.S. Cl. .................. 257/666; 257/677; 257/766; 257/769; 257/776; 257/693; 257/692; 257/768
(58) Field of Search ................... 257/666, 766, 257/769, 768, 676, 758, 693, 692, 677

(56) References Cited

U.S. PATENT DOCUMENTS

| | | | |
|---|---|---|---|
| 4,912,544 | * | 3/1990 | Onuki et al. .................. 257/771 |
| 5,221,859 | * | 6/1993 | Kobayashi et al. .................. 257/676 |
| 5,276,351 | * | 1/1994 | Yamazaki et al. .................. 257/666 |
| 5,343,073 | * | 8/1994 | Parthasarathi et al. .................. 257/666 |
| 5,449,951 | * | 9/1995 | Parthasarathi et al. .................. 257/677 |
| 5,521,432 | * | 5/1996 | Tsuji et al. .................. 257/677 |
| 5,635,755 | * | 6/1997 | Kinghorn .................. 257/666 |
| 5,889,317 | * | 3/1999 | Huang et al. .................. 257/666 |
| 5,914,532 | * | 6/1999 | Akagi et al. .................. 257/677 |
| 5,935,719 | * | 2/1999 | Abbott .................. 257/706 |
| 5,939,214 | * | 8/1999 | Mahulikar et al. .................. 428/626 |
| 5,994,762 | * | 11/1999 | Huang et al. .................. 257/666 |
| 6,034,422 | * | 3/2000 | Horita et al. .................. 257/677 |
| 6,037,653 | * | 3/2000 | Kim et al. .................. 257/667 |

* cited by examiner

Primary Examiner—Alexander O. Williams
(74) Attorney, Agent, or Firm—Gary C. Honeycutt; Fred Telecky

(57) ABSTRACT

A leadframe having the desirable features of palladium plated leadframes, such as compatibility with both wire bonding and solder reflow, as well as good adhesion to molding compounds is provided by plating the interior lead frame portions with one microinch of palladium and the external leads which contact solder with three microinches of palladium. A low cost method for fabricating the leadframe based on a unique combination of proven processes is provided.

2 Claims, 2 Drawing Sheets

LEADFRAMES WITH SELECTIVE PALLADIUM PLATING

CROSS REFERENCE TO APPLICATION

This application is related to U.S. Pat. No. 5,104,510; said patent is incorporated herein by reference.

FIELD OF THE INVENTION

This invention relates to semiconductor devices and more particularly to a leadframe for use in the assembly of such devices, including a method for plating the leadframe.

BACKGROUND OF THE INVENTION

Integrated circuit chips are generally attached to leadframes which provide a way to make an electrical connection to a printed wiring board. The chip is coupled from its bonding pads to the lead fingers of the leadframe by way of gold wires, and the chip along with the inner portion of the lead frame are encapsulated in a package for environmental protection. The leads which remain external to the plastic encapsulation are then soldered to a printed wiring board surface, typically using a solder paste.

The leadframe is formed of highly electrically conductive material, such as copper, copper alloys, or alloy 42 by stamping or etching a metal blank into a plurality of leads, and an area where the chip is mounted. Attachment of the chip to the leadframe, wirebonding and soldering require a particular quality of leadframe surface. Most often the surface to be bonded must be free of oxides or other contaminants, and amenable to metallic interaction with other components, such as gold wire, or solder. For this to be attainable, the surface finish of the leadframe finish plays an important role.

Stamped or etched lead frames are typically plated with a layer of nickel to cover the bare metal, and to serve as a barrier against copper diffusion, as well as to protect the plating bath from contaminants.

Various approaches for treating the bonding surfaces have been employed. Silver plating of the entire leadframe has been largely abandoned because silver migration between external leads resulted in short circuits. Spot silver plating the internal lead fingers provided a bondable surface for gold wires, and the external leads were coated with solder, either by plating or by solder dipping. This multistep process has added expense. Further, delamination of molding compound from lead frames with spot silver plating on the bond fingers and on the chip paddle has been identified as the cause of a failure which frequently occurs during solder reflow of the package to the printed wiring board.

More recently, the entire lead frame surface has been plated with palladium or palladium alloys over nickel containing layers. The nickel acts as a barrier against copper diffusion, as well as protects the plating baths from contaminants. The palladium plated finish provides a bondable surface. A leadframe plating technology which has been in high volume production for a number of years includes the following layers; a nickel strike, a nickel/palladium flash, a thick nickel plate and a palladium layer. A nickel strike over a base copper lead frame is provided to cover the copper and to protect the plating bath from contamination. The nickel/palladium flash serves to inhibit galvanic corrosion by a palladium/copper couple and the thick nickel plate inhibits diffusion of copper during thermal excursions encountered in the assembly of the integrated circuit packages. The thickness of each of the layers is tightly specified to assure that its intended purpose is accomplished.

The final, surface layer of palladium provides a bondable surface. It is well known that palladium is readily soluble in solder and the surface layer will be sacrificed during solder reflow. Palladium is specified in sufficient thickness to protect the underlying nickel from oxidation during assembly of the integrated circuit package so that solderability will not be compromised. Typically palladium plating thickness is 3 to 10 microinches over the entire surface of the leadframe and is applied by flood type electroplating.

However, there is a persistent need to improve and simplify current leadframes and plating procedures, while retaining all the desirable characteristics of palladium plated surfaces.

SUMMARY OF THE INVENTION

The primary object of the present invention is to provide a leadframe having a palladium surface finish with all the desirable characteristics of said finish, but without wasting precious metal as routinely required in prior systems. It is a feature of this invention that the portion of the leadframe which is external to the plastic package and which comes into contact with solder comprises palladium, in a minimum of 3 microinches thickness, and the internal portion of the unit has a lower palladium plating thickness. Said internal plating thickness comprising palladium is a minimum of 1 microinch; this level which has been shown to be sufficient for thermosonic bonding to gold wires. The external plating thickness is unchanged from present technology and therefore, does not cause any disruption in the user board assembly process.

It is also a feature of the present invention that said leadframe presents a single surface composition to the encapsulating molding compounds, and that surface provides good adhesion to molding compounds.

It is further a discovery of the present invention that because the leadframe finish comprises only a palladium plated surface, variations in thickness at the transition area constitute no reliability or cosmetic problems. Such variations typically occur with spot plating as a result of plating solution bleed at the masked interface. This feature permits relaxed specifications for edge control of the plated spot.

The leadframe of the present invention provides a palladium plating which may be used with a copper base metal, or with other base metals without contamination of the top surface resulting from a galvanic potential between the palladium top surface and the base metal.

According to the present invention, the external lead finish which comes into contact with solder has a minimum thickness of 3 microinches. In one aspect the lead finish on packages which are surface mounted to the board will have 3 microinches of palladium on a single side which will be contacted by solder. In yet another aspect, those semiconductor packages which are designed for through hole mounting, such as duel-in-line (DIP) packages or pin grid arrays (PGAs), will have a minimum of 3 microinches of solder on all sides.

Another feature of the invention provides that there is a 1 microinch layer of palladium over the entire surface of the lead frame, and that an additional 2 microinches is spot plated on the external leads from the dam bar location. In yet another aspect, spot plating of 2 microinches of palladium is applied to the external leads, and then full lead frame is flood plated with 1 microinch of palladium.

Other objects and advantages of the present invention will become apparent from the following descriptions, taken in connection with the accompanying drawings, wherein by way of illustration and example, an embodiment of the present invention is disclosed.

In accordance with the present invention, there is further provided a low cost method for fabricating a lead frame having a minimum of three (3) microinches of palladium on the external leads which come into contact with solder during board assembly, and one (1) microinch, minimum, of palladium plating on the lead frame which is internal to the encapsulating plastic. This method is applicable to lead frames of copper, copper alloy or any other base material. The method is described for a preferred embodiment wherein the leadframes are processed in a continuous strip, and it makes use of an equipment for spot plating which has been described in a related patent, U.S. Pat. No. 5,104,510 and which is incorporated herein by reference.

The preferred method for forming the leadframe device of this disclosure comprises the following steps: punching or etching a continuous metal strip into a series of frames having a plurality of leads and a central location for die attachment. In a series of baths the leadframe strips are cleaned to remove contaminants, the surface activated by an acid dip, and a nickel strike plated on the surface to protect the plating bath from contaminants. This is followed by plating a NiPd flash to inhibit galvanic corrosion by a Pd/Cu couple, plating a thick nickel layer to inhibit thermally driven copper diffusion and the full surface flood plating with one microinch of palladium. The continuous leadframe strip is then passed through a plating wheel assembly for plating system wheel assembly for electroplating a minimum of 2 microinches of palladium onto the external leads through fluid passages in a sparger shaft.

While a method for fabrication of the leadframe of the present invention has been described in a preferred embodiment, it is not intended to limit the scope of the invention to the particular form set forth, but on the contrary, it is intended to cover such alternatives, modifications, and equivalents as may be included within the spirit and scope of the invention.

The drawings constitute a part of this specification and include exemplary embodiments of the invention, which may be embodied in various forms. It is to be understood that in some instances aspects of the invention may be shown exaggerated or enlarged to facilitate an understanding of the invention.

DETAILED DESCRIPTION OF A PREFERRED EMBODIMENT

Figure 1:
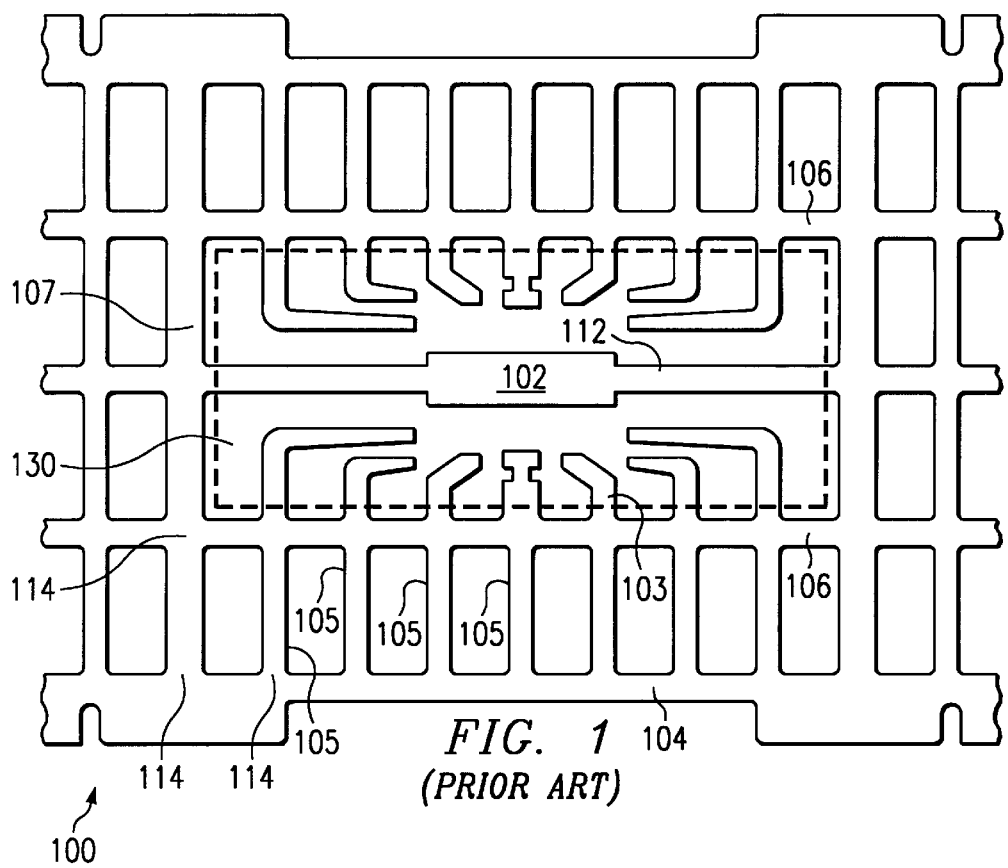
FIG. 1 depicts a typical leadframe design.

Referring now to the drawings, in FIG. 1 there is shown a typical leadframe design 100 having a plurality of leads and a die paddle 102. The integrated circuit chip will be located on the die paddle 102, and attached typically by a conductive adhesive. The die paddle is connected to the leadframe support strap 107 by a tie bar 112. The lead fingers 103 which are internal to the integrated circuit package are designed to approach the central portion of the leadframe, and the tips of those fingers are the area onto which wire bonds are connected from the chip bonding pads.

The external leads 105 are spaced evenly and have a standardized design which will be used for attaching the encapsulated integrated circuit package to a printed wiring board. The external leads are connected to a carrier strip 104 which is used for transport during lead frame and integrated circuit package processing; it will be cut away at point 114 after the package has completed all processes which are carried out in strip form. At the junction of internal and external leads is a dam bar 106 along whose inner edge the molded package which will be formed in an area bounded by the dashed line 130. The dam bar 106 and support strap 107 will be removed after assembly of the package has been completed in an operation called trim and form.

Figure 2:
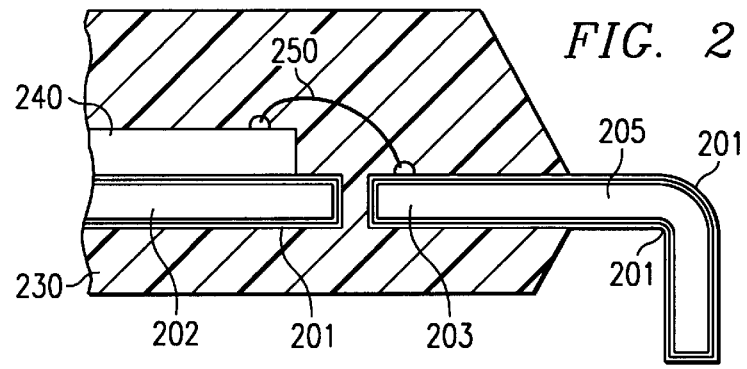
FIG. 2 provides a cross sectional view of an encapsulated lead frame.

In accordance with the present invention, and as depicted in FIG. 2, the outermost surfaces 201 of said leadframe 100 comprises palladium. The thickness of the palladium layer on the leadframe inside the encapsulating package 130, which includes the die paddle 102 and internal lead fingers 103, is a minimum of one (1) microinch and is the range of one to five microinches. The thickness of the palladium layer on the leads external to the package is a minimum of three (3) microinches, and in the range of three to ten microinches. As shown in FIG. 2, an integrated circuit chip 240 is attached to the die paddle 102, the chip is connected by wire bond 250 to the internal lead fingers 103, and the assemblage is encapsulated in a plastic package 130. In accordance with this invention, the thickness of the palladium layer 201, is increased to a minimum of 3 microinches where the leads exit the encapsulation.

Figure 3A:
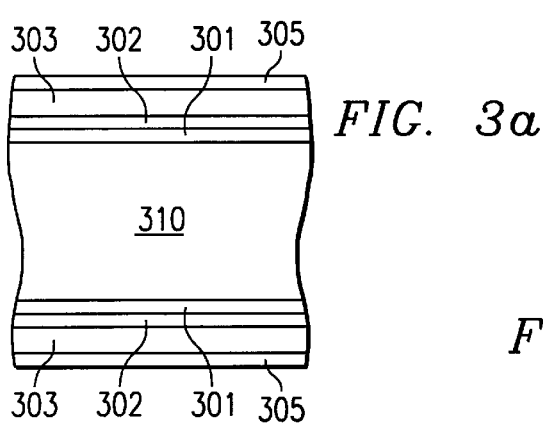
FIG. 3a depicts in detail the leadframe plated layers internal to the encapsulation.
Figure 3B:
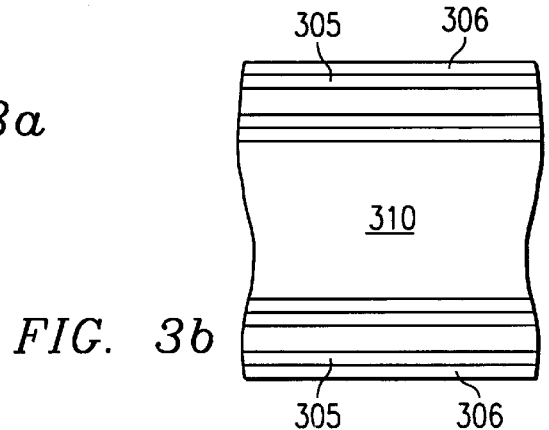
FIG. 3b depicts in detail the leadframe plated layers which contact solder.

To explain in further detail the plating composition of a preferred embodiment, FIGS. 3a and 3b show the multiple plated layers of said leadframe. A base metal leadframe 310 comprises copper in the range of 0.006 to 0.010 inches thickness with coatings of a nickel strike 301, a flash layer of palladium/nickel 302, a thicker nickel 303 plated layer, and a flood plated layer 305 comprising palladium. FIG. 3b depicts the plating layers of an external lead 102, wherein an additional layer of palladium 306 is present to provide a minimum of three (3) microinches plating.

Figure 4A:
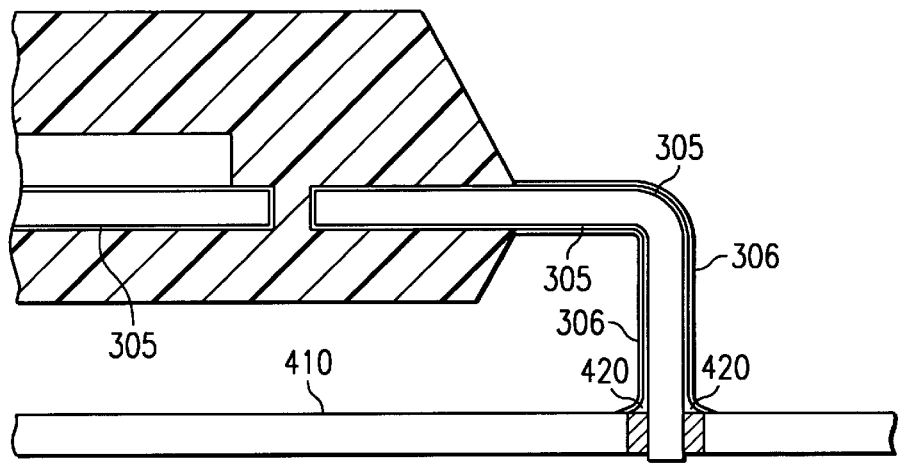
FIG. 4a demonstrates a through hole mounted device and plated layers.
Figure 4B:
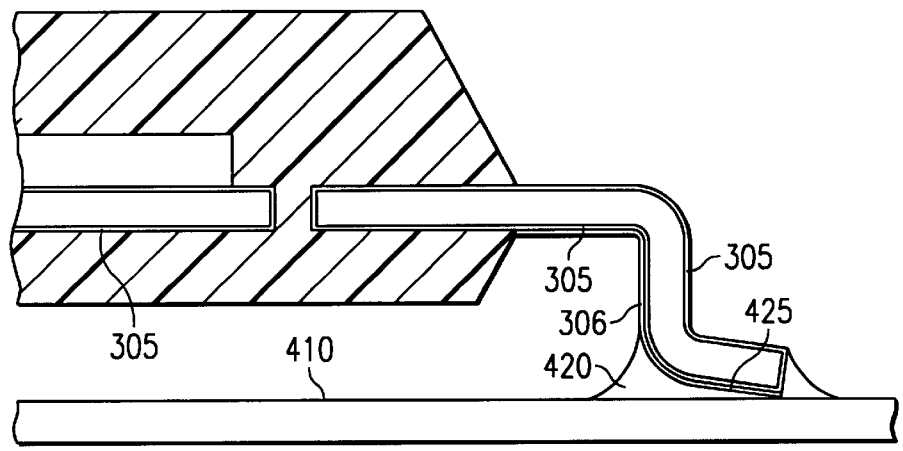
FIG. 4b demonstrates the plated layers on a gull wing mounted device.
Figure 4C:
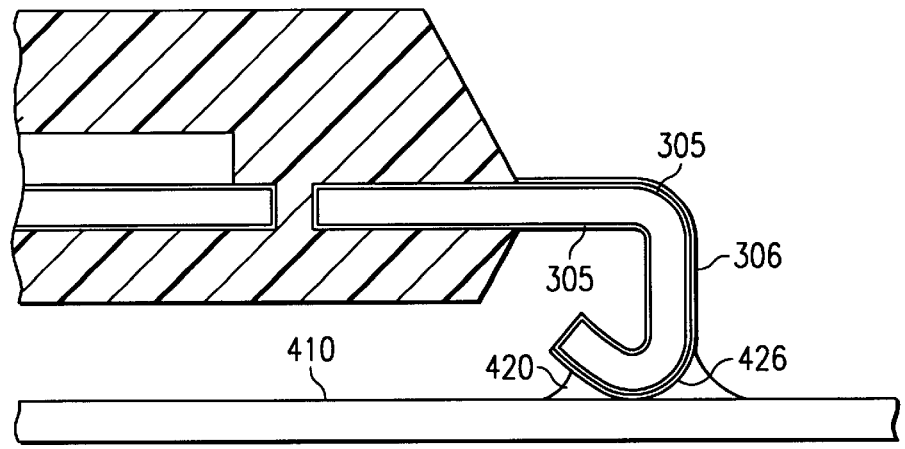
FIG. 4c demonstrates the plated layers on a j-lead device.

It can be seen that the integrated circuit package design in FIG. 4a represents a device which is through hole mounted onto the printed circuit board 410, and as such will come into contact with solder 420 on all sides of the external leads. It is a feature of this invention that these leads will have will have palladium layers 305 and 306, to comprise a total of 3 microinches, minimum on leads contacted by solder. FIG. 4b demonstrates a gull wing package and FIG. 4c depicts a j-wing package, both of which are surface mounted onto the printed wiring board 410. The gull wing configuration comes into contact with solder 420 only on the bottom side 425 of the external lead, and on the other hand the j-lead package contacts solder on the top side of the lead. Surface mounted packages require thicker palladium, layers 305 and 306 only in the area which contacts solder, and therefore the leads on the solder contact side have 3 microinches of palladium; i.e., the bottom side for gull wing and top side for j-leads packages. Only one microinch of palladium or layer 305 is required on the non-solder contact side.

To explain further the significance of palladium plating thickness on the bonding surfaces, it has been demonstrated in high volume production that one microinch of palladium is sufficient for gold wire bonding. Plastic duel-in-line packages were assembled through wire bonding and encapsulation with a uniform coating of one microinch of palladium on the leadframe, and the external leads were subsequently solder dipped. For wire bonding, a clean, smooth surface finish, and a material which is compatible with gold is necessary; one microinch of palladium over thick nickel plating provides such a surface.

Palladium is highly soluble in solder and is sacrificed during solder board attach, but a layer 3 microinches of palladium on leadframes has been demonstrated to provide a solderable surface. In the assembly of an integrated circuit package, processing steps involve heating which results in some diffusion of nickel into palladium. It is necessary that palladium be of sufficient thickness to prevent nickel oxidation because nickel oxides are not solderable, and three microinches has been demonstrated from high volume production to provide a sufficient palladium thickness.

Further, in accordance with the present invention, there is provided a leadframe surface comprising only palladium which provides good adhesion to molding compounds. In contrast, leadframe surfaces of different compositions, and in particular spot silver over nickel has been shown to delaminate readily from the molding compound under processing conditions such as surface mount.

It is still further a feature of the present invention that spot plated palladium on palladium provides a uniform material composition and any thickness nonuniformity, such as from bleed at the spot edge interface is acceptable from adhesion or cosmetic aspects, and in turn results in relaxed specifications for spot placement.

Turning now to a method for fabricating a leadframe with different thickness of palladium in selected locations. A reliable, flexible, low cost process which is amenable to high volume manufacturing is provided as a preferred embodiment of the present invention. The process provides for fabricating leadframes in strip format using a unique combination of existing technologies. A metal strip comprising copper is formed by etching or stamping into a series of leadframes with a plurality of lead fingers and a die paddle held and together by a carrier strip. The formed strip is transported through the following fabrication processes; cleaning to remove oils and dirt, activating the surface by an acid dip to remove oxides and reduce the surface, plating a very thin nickel flash which covers the copper and protects the plating bath from contamination. The continuous strip is subjected to a series of flood plating baths to form a thin flash of palladium/nickel, followed by a thick layer of nickel, and a flood plated layer of palladium, one microinch, minimum in thickness. The strip is then processed through a spot plating assembly, using a plating system wheel assembly on a stationary sparger shaft with fluid passages. This system is described in detail in U.S. Pat. No. 5,104,510 and which is incorporated herein by reference. The plating wheel apertures are designed to expose the external leads to plating solution, and the speed, fluid pressure and current are controlled to provide an increased thickness of palladium to 3 microinches, minimum on the external leads.

Those devices requiring 3 microinches of palladium on both sides will be reversed in exposure pattern and subjected to the spot plating assembly a second time. The plated leadframe is cut and offset to complete the fabrication processes.

While alternate spot plating technology, such as rubber masking is applicable for this leadframe fabrication, there are significant advantages to this low cost approach. Very high speed and throughput are accomplished, and further, it is a feature of the present invention that because the surface plating material composition is uniform, i.e., palladium on palladium, highly accurate edge placement of the spot is not necessary, and therefore relaxed specifications in the range of plus or minus 0.010 inches at the design of spot edge will be used. It is further a feature of this invention that backstripping of any bleed onto the leadframe backside is not required because of the uniform composition.

In summary, a leadframe having the desirable features of palladium plated leadframes, such as compatibility with both wire bonding and solder reflow, as well as good adhesion to molding compounds is provided by plating the interior lead frame portions with one microinch of palladium and the external leads which contact solder with three microinches of palladium. A low cost method for fabricating the leadframe based on a unique combination of proven processes is provided.

What is claimed is:

1. A leadframe having a die paddle and plurality of leads; wherein said leads have a portion which is to be internal to a plastic package encapsulating a semiconductor device, and a portion of the leads to be external to the encapsulation, said lead frame comprising:

a) a copper base material,
   b) a flash layer of nickel conveying said base material;
   c) a thin layer of palladium/nickel covering said flash layer;
   d) a thick layer of nickel covering said thin layer;
   e) a one microinch coating comprising palladium covering said thick layer on the internal leads and die paddle, and
   f) a three microinch coating comprising palladium covering said thick layer on the external leads which are designed to be solder contacted during assembly to the next level on intercomnection.

2. A lead frame as in claim 1 further comprising a first layer of nickel on said leadframe, under the said palladium layers.

* * * * *

UNITED STATES PATENT AND TRADEMARK OFFICE
CERTIFICATE OF CORRECTION

PATENT NO. : 6,194,777 B1  
DATED : February 27, 2001  
INVENTOR(S) : Donald C. Abbott, Paul R. Moehle Page 1 of 1

It is certified that error appears in the above-identified patent and that said Letters Patent is hereby corrected as shown below:

<u>Title page,</u>
Insert item [60] under Related U.S. Application Data
-- Provisional Application No. 60/090,936 June 27, 1998. --

Signed and Sealed this

Thirtieth Day of October, 2001

*Attest:*

Nicholas P. Godici

*Attesting Officer*

NICHOLAS P. GODICI
*Acting Director of the United States Patent and Trademark Office*